United States Patent [19]

Rosar et al.

[11] Patent Number: 5,481,111

[45] Date of Patent: Jan. 2, 1996

[54] ELECTRON MICROSCOPE HAVING A GONIOMETER CONTROLLED FROM THE IMAGE FRAME OF REFERENCE

[75] Inventors: Madeleine E. Rosar, Suffern; Karen I. Trovato, Putnam Valley, both of N.Y.; Leendert Dorst, Amsterdam; Thomas P. H. Warmerdam, Eindhoven, both of Netherlands

[73] Assignee: Philips Electronics North America Corporation, New York, N.Y.

[21] Appl. No.: 176,051

[22] Filed: Jan. 3, 1994

[51] Int. Cl.⁶ .................................................. H01J 37/26
[52] U.S. Cl. ...................................... 250/311; 250/442.11
[58] Field of Search ............................ 250/440.11, 442.11, 250/310, 311

[56] References Cited

U.S. PATENT DOCUMENTS

| | | | |
|---|---|---|---|
| 3,629,577 | 12/1971 | Karlsruhe et al. | 250/442.11 |
| 3,727,051 | 4/1973 | Page | 250/441.11 |
| 4,058,731 | 11/1977 | Müller et al. | 250/442.11 |
| 4,433,382 | 2/1984 | Cunningham et al. | 364/474 |
| 4,627,009 | 12/1986 | Holmes et al. | 250/442.11 |
| 4,661,968 | 4/1987 | Wondergem | 378/79 |
| 5,038,089 | 8/1991 | Szakaly | 318/568.11 |
| 5,208,763 | 5/1993 | Hong et al. | 364/551.02 |

OTHER PUBLICATIONS

"Design of a New, Five Axis Motorised Goniometer for the CM Series Microscope the Compustage" P. Emile et al, Philips Electron Optics, pp. 1–12 Nov. 1993.

*Primary Examiner*—Bruce C. Anderson
*Attorney, Agent, or Firm*—Jack D. Slobod

[57] ABSTRACT

A separate user frame of reference is provided for the operator of an electron beam microscope to use in generating position and tilt commands for a motorized goniometer, rather than requiring that the operator input position and tilt commands to the motorized goniometer in the same frame of reference used by the goniometer to implement position and tilt changes. The electron beam image observed by the operator on a display screen furthermore forms the separate user frame of reference in order to make control of the specimen by the operator intuitive. Since the operator observes the user frame of reference and generates position and orientation commands in the user frame of reference, navigation around the sample is easy to accomplish, even for a novice operator. The image does not inadvertently rotate when other specimen movements are intended and an unintended modification in position along the beam axis does not occur for the imaged portion of the specimen unless the operator inputs such a modification.

5 Claims, 6 Drawing Sheets

ELECTRON MICROSCOPE HAVING A GONIOMETER CONTROLLED FROM THE IMAGE FRAME OF REFERENCE

BACKGROUND OF THE INVENTION

1. Field of the Invention

The present invention pertains to electron microscope specimen positioning systems (i.e., goniometers) and more particularly to a computer controlled goniometer.

2. Description of the Related Art

In an electron microscope, a set of magnetic lenses focuses a bundle of electrons onto a specimen. Electrons leaving the specimen are focused by another set of magnetic lenses and imaged onto an electron sensitive layer of some kind, such as the surface of a fluorescent viewing screen or an electron sensitive emulsion on a film or plate to create a micrograph.

The optical image created by a fluorescent screen also may be captured by a still, video or movie camera, recorded on light sensitive film or electronically on tape, and displayed as a photograph, movie or in real-time on a display monitor or TV. While conventional cameras may be used via an observation port, special cameras are also available for improved imaging on a display monitor or TV screen. For example, the Model 694 Slow Scan Camera made by Gatan Inc., 780 Commonwealth Drive, Warrendale, Pa. detects the electron image with either a single-crystal YAG or powder phosphor scintillator and fiber-optically couples the detected image to a high resolution charge-coupled device (CCD). The CCD image is then scanned to produce signals suitable for display on a monitor. This Gatan camera provides an image on a display screen which is magnified more than 20 times larger than an image produced directly by a conventional fluorescent viewing screen.

The optical image is viewed by an operator either directly on a fluorescent viewing screen or on a display monitor and assists the operator in controlling the electron microscope. Operation generally consists of mounting a specimen in a specimen holder, placing the specimen holder in a multiple axis mechanical positioning system called a goniometer, and then changing the position and orientation of the specimen about the movement axes, all while the operator is looking at an optical version of an electron beam image or pattern produced by the specimen, until a desired image or pattern is obtained.

In a conventional electron microscope, the specimen is carried near the end of a rod, which extends through a spherical pivot in or around a port of the electron beam column, so that the rod can swing in two directions, generally horizontally and vertically. The rod is also movable in an axial (i.e., radial) direction and can be axially rotated as well to tilt the specimen. Some specimen holders also allow the specimen to be tilted in a second direction and provide mechanical linkage within the rod for control of such tilt. The rod assembly part is usually removable from the mechanical positioning system which controls it and is called the specimen holder, while the mechanical positioning system into which the specimen holder fits and which is used to control the position and orientation of the specimen held in the specimen holder in combination with the specimen holder is called a goniometer. Sometimes the mechanical positioning system alone (i.e., without the specimen holder) is called a goniometer. In the following description therefore, the word "goniometer" may at times refer to only the mechanical positioning system and at other times refer to the combination of the mechanical positioning system with the sample holder.

Adjustments in all directions of adjustment are made directly by the operator, generally by turning knobs. Normally, one knob changes the position of the specimen in the radial direction along the axis of the specimen holder (hereinafter called the goniometer axis). A second knob swings the goniometer axis about the spherical pivot point in a first angular direction and a third knob swings the goniometer axis about the pivot point in a second angular direction perpendicular to the first angular direction. Since these swing angles are typically small, the positional adjustments to the specimen made by these three knobs typically approximates an X-Y-Z cartesian coordinate system (and the operator typically thinks adjustments are being made in a cartesian frame of reference), though in reality the specimen is being positioned by knobs which move the specimen in a polar coordinate system.

The orientation of the specimen holding stage in the specimen holder is also controllable typically via one or more knobs. One knob typically rotates the specimen holder about the goniometer axis, thus tilting the specimen in one direction of tilt. If only one direction of tilt adjustment is provided, the goniometer is called a single-tilt goniometer. When tilt adjustment is provided in two directions of tilt, the goniometer is called a double-tilt goniometer. The second direction of tilt is provided typically by supporting the specimen holding stage at the end of the specimen holder rod so as to allow it to be rotated about an axis that is perpendicular to the axis of the goniometer and parallel to the specimen surface. Rotation about this axis may be controlled, for example, via a rod within the body of the goniometer that is attached to the specimen holding stage.

The problem with controlling a conventional goniometer is that an operator does not find that it is very intuitive which knob or knobs to turn (and in which direction) to achieve a desired result. This results from the fact that the image orientation displayed on a screen and the specimen orientation normally have some rotational phase relationship between them, which is not known in advance and worse yet is not ordinarily constant when the specimen position is being altered.

In a TEM, any change in position of the specimen irradiation spot along the axis of the incident electron beam results in a rotation of the image due to the magnetic lenses being used and the helical path that they cause the electrons to take. Any change in tilt angle of the specimen ordinarily results in some incidental change in position of the irradiation spot along the beam axis (due to the fact that ordinarily the axes of tilt rotation do not pass through the electron beam axis) and therefore causes some rotation of the image. Furthermore, whenever the specimen is tilted, any movement of the specimen in any one of the translational directions will also cause some movement of the incident spot in the direction of the beam axis and result in some rotation of the observed image.

As a result, the image tends to rotate at the same time as it makes a linear movement or a tilt movement, which makes it difficult for operators to navigate around a specimen while looking at the image. If a spot is seen on the screen near an edge of the field of view and it is desired to center the spot, for example, operators often inadvertently move the desired spot out of the field of view and have difficulty finding it again.

Another problem with manually controlled goniometers is that the range of possible travel for the stage is typically great enough that a collision can occur between the goniometer (or specimen) and a polepiece of the electron microscope. If a collision does occur, which is likely with inexperienced operators, damage can occur to a polepiece which is very expensive to repair. The polepieces of modern electron microscopes furthermore are getting closer and closer to each other (and to the specimen between them) because closer polepieces produce more precise images.

In Japanese Patent Application No. 2-49304 (filed Mar. 2, 1990 and corresponding to Kokai 3-254055 dated Nov. 13, 1991), an electron microscope is described in which motion commands for the goniometer are input to a processing system that calculates a limit for movability and transmits only motion commands within this limit to a drive system that implements them. It is said that this allows for setting the motion limit while correlation between the goniometer position and orientation are taken into consideration in order to allow movement only within a range such that the goniometer does not touch an objective stop. While this reference might have generally identified the objective of avoiding collisions, and might have generally suggested a way of preventing a collision if the operator inputs a motion command that would otherwise result in a collision, apparently no help is given to the operator in controlling sample motion (i.e., navigating around the sample) more intuitively and without getting lost.

SUMMARY OF THE INVENTION

It is an object of this invention to assist an operator of an electron microscope in navigating around a sample while looking at the image of the sample on a display screen.

Another object is to prevent an operator from causing a collision between a sample and/or sample holder and a polepiece of an electron microscope.

It is also an object to create a separate frame of reference for user inputs rather than require the user to use the same frame of reference created by the goniometer mechanical movement system.

It is a further object to allow an operator of an electron microscope to input position and orientation (i.e., tilt) commands for a sample in the frame of reference that the operator sees while looking at an electron beam image of the sample on a display screen.

Still another object is to allow an operator to position and orient a sample in an electron microscope using computer input commands from a keyboard, mouse, joystick, touchscreen or voice control.

These and further objects and features of this invention are achieved by providing a separate frame of reference for the operator to use in generating position and tilt commands for the goniometer, rather than requiring that the operator input position and tilt commands in the same frame of reference used by the goniometer to implement position and tilt changes. This allows the goniometer mechanical movement system to use an optimum frame of reference system for goniometer movement without any imposed constraints from user interface factors. At the same time, an optimum user input frame of reference may be adopted without any imposed constraints from the mechanical movement system. Heretofore, a single frame of reference has been used by both the user and the mechanical system, resulting in compromises and disadvantages.

In accordance with this invention furthermore, the electron beam image observed by the operator on a display screen forms the separate user frame of reference in order to make control of the specimen by the operator intuitive. The mechanical movement system frame of reference is ideally defined by the mechanical movement system itself, which may take any form now that there are no constraints from user factors. As a consequence, the mechanical movement system may be optimized in any fashion and any existing technology may be directly used in this subsystem, such as robot arm technology.

In the preferred embodiment, operator position commands for the goniometer are generated by keyboard, mouse, joystick, touchscreen or voice command input in a user X-Y-Z coordinate system corresponding directly to an electron beam image on a display screen observed by the operator. A user X direction is defined as the horizontal direction of the electron beam image on the screen (with the X axis lying horizontally across the center of the image); the user Y direction is defined as the vertical direction of the image on the screen (with the Y axis lying vertically across the center of the image); and the user Z direction is defined as being perpendicular to the user X and user Y directions (i.e., perpendicular to the image on the screen).

Orientation (i.e., tilt) commands are also generated by keyboard, mouse, joystick, touchscreen or voice command input as rotation commands about one or more of the axes of the user frame of reference defined by the electron beam image on the screen.

Position and orientation commands generated by an operator in the user frame of reference are received by a processor and translated from the user frame of reference into the frame of reference used by a drive system for the goniometer. In the preferred embodiment, each translated position and/or orientation command is checked furthermore by the processor to make sure that the path of the goniometer will not cause a collision with a polepiece. If no collision will occur, the translated positioning and/or orientation command is implemented by the goniometer drive system.

The operator input commands are preferably commands which cause an incremental change in position and/or orientation in the user frame of reference with respect to the present position and/or orientation in the user frame of reference. In the preferred embodiment, the commanded changes are furthermore subdivided into small incremental changes. The goniometer control system moves the sample from its present position and orientation to the new position and orientation in small steps. Each step change in position or orientation of the sample is checked for possible collision of the goniometer with a polepiece before it is implemented.

Since the operator observes the user frame of reference and generates position and orientation commands in the user frame of reference, navigation around the sample is easy to accomplish, even for a novice operator. The image does not inadvertently rotate when other specimen movements are intended and an unintended modification in position along the beam axis does not occur for the imaged portion of the specimen unless the operator inputs such a modification.

BRIEF DESCRIPTION OF THE DRAWINGS

A preferred embodiment of the invention will now be described in detail by referring the drawings in which.

DESCRIPTION OF A PREFERRED EMBODIMENT

Figure 1:
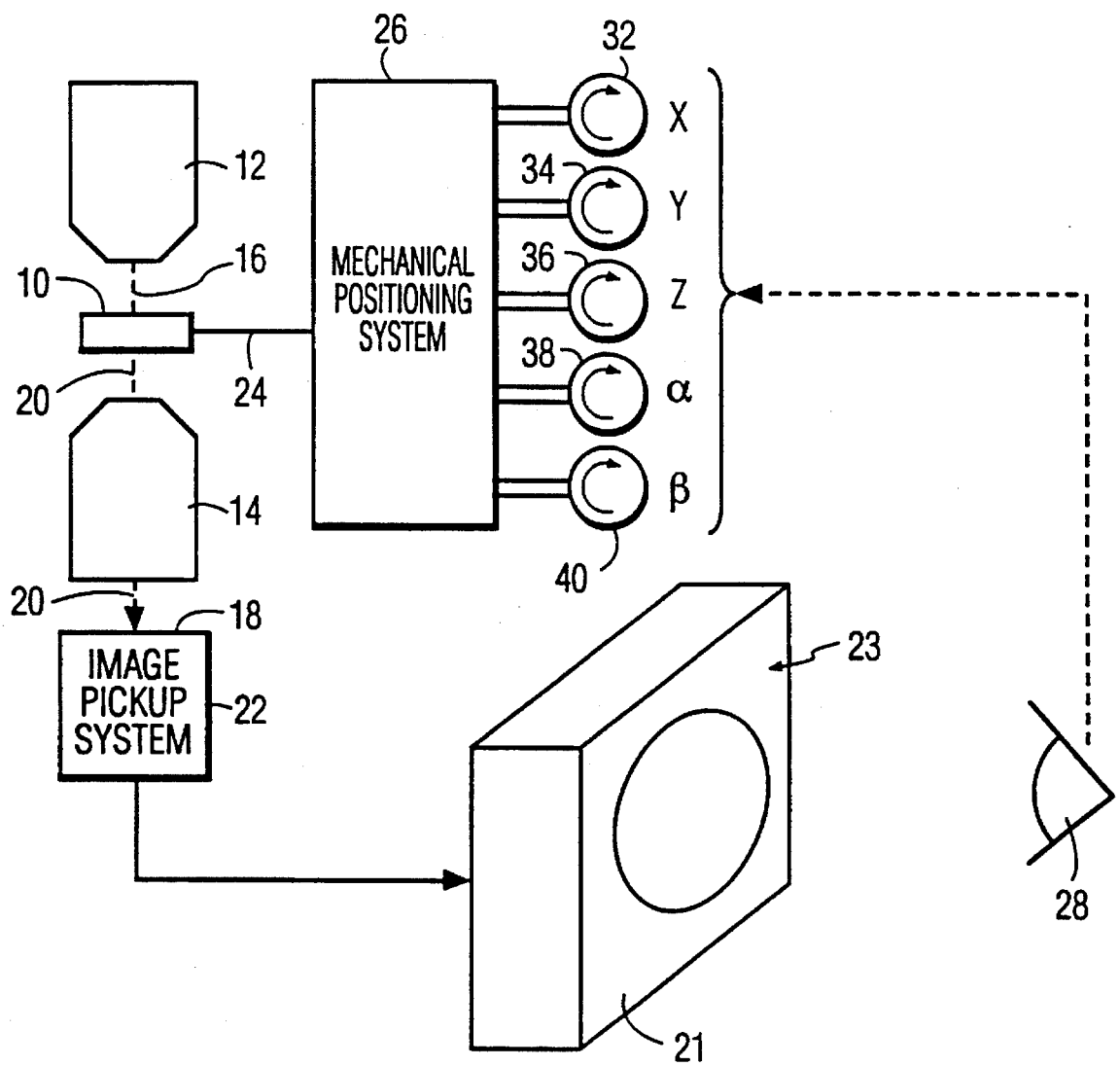
FIG. 1 is a schematical representation of a prior art electron microscope.

FIG. 1 schematically illustrates a typical prior art transmission electron beam microscope (TEM) system having a monitor screen to display the electron beam image. A thin specimen 10 is positioned between a source portion 12 and an imaging portion 14 of an electron beam column. Within the source portion 12, an electron emitter (such as a heated lanthanum hexaboride crystal or tungsten filament) generates electrons, which are electrostatically accelerated to form a source electron beam. The source electron beam is focussed by magnetic condenser lenses in the source portion 12 to form a small diameter irradiation beam 16.

Specimen 10 is positioned so that electron beam 16 irradiates a small region of specimen 10. Within the specimen, typically some electrons are reflected to a new angle, some are diffracted to a new angle, and some pass through without diffraction or reflection. Electrons 20 emerging from the other side of the specimen are received into the imaging portion 14 of the electron beam column. Specimen 10 is typically immersed in the magnetic field of an objective lens (of imaging portion 14), which focuses the emerging electrons 20 onto the back focal plane of the objective lens, where a diffraction pattern is formed. Additional magnetic projector lenses in portion 14 either transfer the diffraction pattern or form an electron image on an electron sensitive surface 18 of a TV pickup system or camera 22. Image pickup system 22 receives the electron pattern or image and converts it into electronic signals suitable for display on a user monitor screen 24 as an optical pattern or image 26. Various schemes have been used in the prior art to convert an electron image into signals suitable for display on a monitor. The Gatan camera described earlier is one example. Monitor 24 displays an optical image corresponding to the electron pattern or image created on surface 18.

A more complete and much more detailed description of conventional electron beam microscopy may be found in any one of many textbooks, such as: "Transmission Electron Microscopy" by L. Reimer, published by Springer-Verlag (1984); "Experimental High-Resolution Electron Microscopy" by J. C. H. Spence, published by Oxford University Press (1988); "Electron Microscopy of Thin Crystals" by P. Hirsch, A. Howie, R. B. Nicholson, D. W. Pashley and M. J. Whelan, published by Robert E. Krieger Publishing Co. (1977); and Transmission Electron Microscopy of Materials" by G. Thomas and M. J. Goringe, published by Wiley and Sons (1979). The teachings of these books are hereby incorporated by reference.

In practicing the present invention, any conventional electron beam column may be used, as well as any conventional TV pickup system or camera and any conventional monitor. The invention more particularly deals with the problem of positioning specimen 10 with respect to the electron beam column. Specimen 10 is carried at the end of a specimen holder 24 (schematically represented in FIG. 1), which fits into a specially designed mechanical positioning apparatus 26 called a goniometer. The goniometer allows an operator to adjust the specimen in position with respect to the electron beam column in multiple translational directions in very small increments and typically to adjust the specimen in orientation (i.e., tilt) as well.

Figure 2:
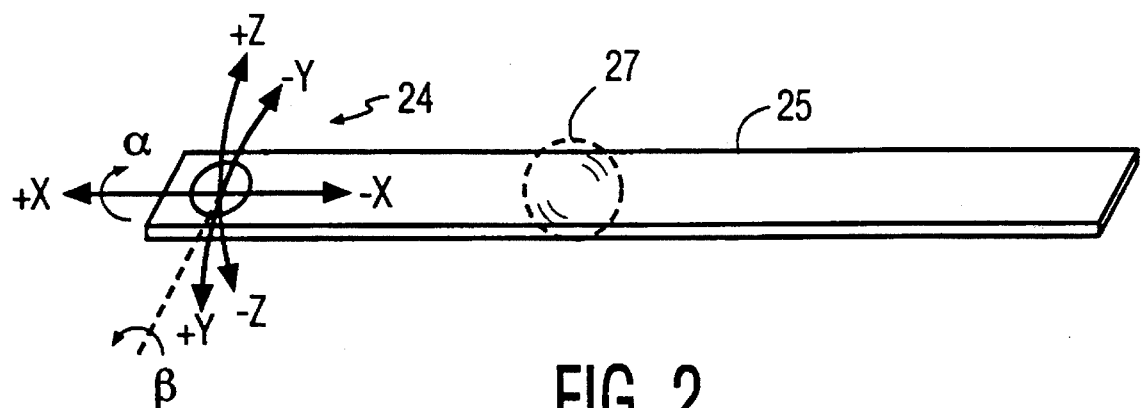
FIG. 2 shows a typical prior art specimen holder portion of a goniometer and the single coordinate system used by an operator to control specimen movement.

FIG. 2 shows a typical prior art specimen holder 24 and the single coordinate system used by an operator and by the mechanical positioning system to control the position and tilt of a specimen 10 carried at the end of a specimen holding rod 25 that is supported remotely of the specimen in a spherical bearing 27 forming a spherical pivot point. The positioning system 26 illustrated in FIG. 1 can position the specimen with the 5 degrees of positioning freedom described earlier and illustrated now in FIG. 2. The specimen may be moved in the radial direction X of an axis defined by the goniometer specimen holder axis by sliding the rod 25 inward or outward through the spherical bearing. The specimen holder rod may also swing left and right in a direction Y about the spherical pivot, which moves the specimen through an arc as shown. Also the specimen holder rod may swing up and down about the spherical pivot in a direction Z, which moves the specimen through another arc as shown. The specimen may be tilted as well by rotating the specimen holder rod in a direction $\alpha$ about the axis X. As the specimen swings left or right and up or down, the axis X also swings and so does the axis of the rotation direction $\alpha$. The specimen furthermore is mounted on a stage (not shown) in the specimen holder arm for rotation about an axis 25 in a direction $\beta$ for a second direction of tilt control. The axis 25 of the direction $\beta$ also swings with the arm as it moves in the Y of Z directions. The defined directions have been labelled as if this were an orthogonal cartesian reference system, which it approximates with very small angles of swing.

The mechanical positioning system 26 (i.e., goniometer) typically has a group of knobs 32, 34, 36, 38 and 40, which are used by an operator 28 looking at screen 24 to control the position and tilt of the specimen. For example, to move the specimen in the X direction, the operator turns the X knob 32. To move the specimen in the Y direction, the operator turns the Y knob 34. To move the specimen in the Z direction, the operator turns the Z knob 36. Knob 38 is used by the operator to tilt the specimen in the $\alpha$ direction and knob 40 is used to tilt the specimen in the $\beta$ direction. An operator looks at the image on screen 24 and turns these knobs until the specimen is moved to a desired position.

Figure 3:
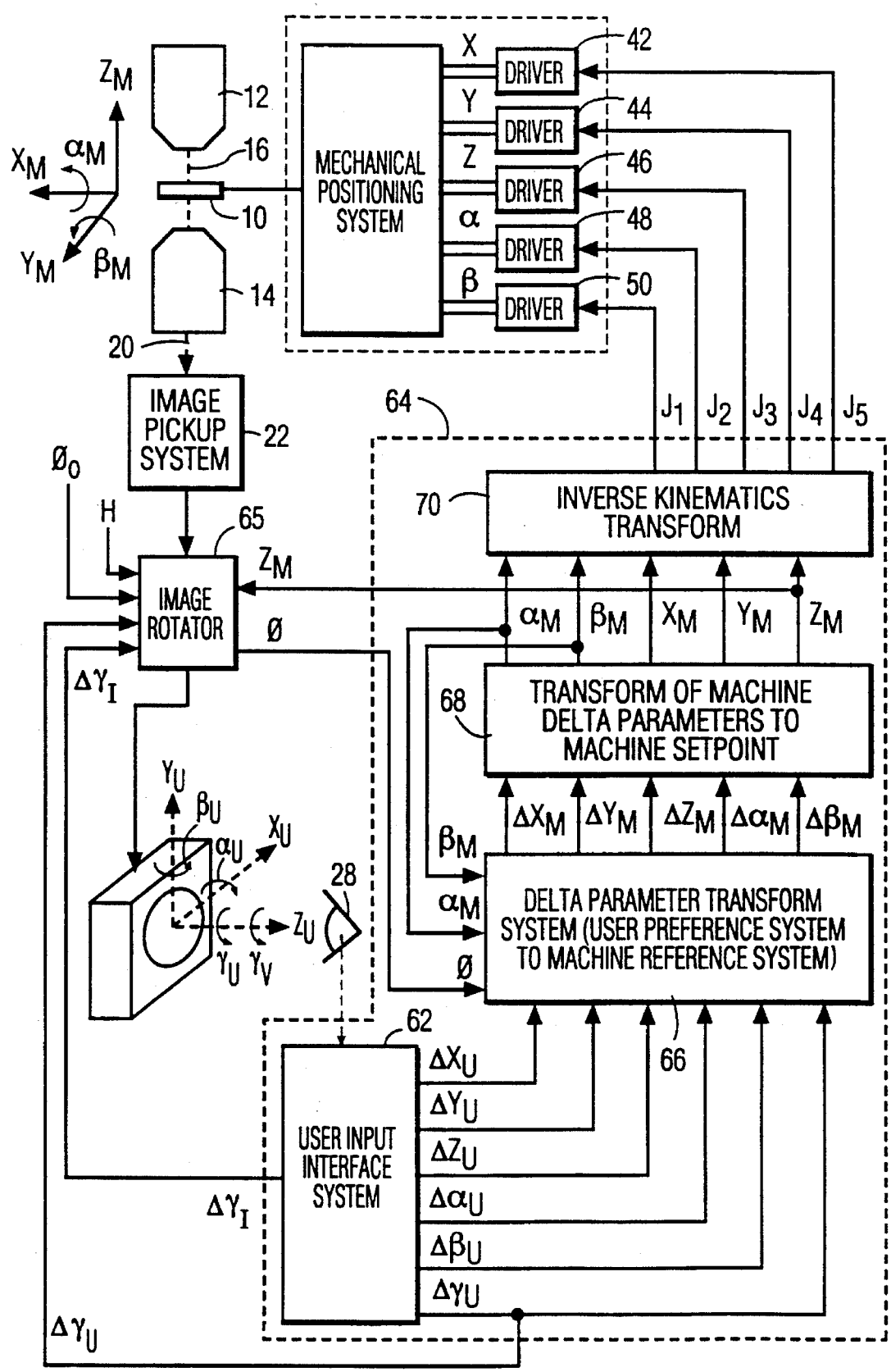
FIG. 3 is a block diagram of an electron beam microscope incorporating the present invention.

FIG. 3 is a schematic diagram of an electron microscope incorporating the present invention. A conventional electron beam column 12, 14 is used, as well as a conventional pickup system 22 and user screen 24. The mechanical positioning system 26 for specimen 10 is assumed to be the same mechanical positioning system shown in FIG. 1, but it has been modified, however, in accordance with the invention, so that it is now controlled by electro-mechanical drivers 42, 44, 46, 48 and 50 rather than mechanical input from the operator. The modification may be made, for example, simply by installing stepper motors in place of the knobs 32, 34, 36, 38 and 40 shown in FIG. 1. Any conventional goniometer may be modified similarly so that the mechanical controls become operated by electromechanical drivers rather than directly by a user's hand. Motorization of a conventional goniometer mechanical positioning system has the advantage over designing a new mechanical positioning system in that the mechanical positioning system need not be redesigned, since the mere addition of electro-mechanical drivers, such as stepper motors, is a simple engineering modification.

As should become more apparent, however, as the present invention is described in more detail, existing goniometers have been designed with the user interface in mind, so the mechanical system is designed as well as possible such that the individual knob controls will create physical movements in perpendicular and independent linear directions, and tilts about these directions as well, ideally in an orthogonal cartesian coordinate system familiar to users. This is achieved only approximately in typical prior art goniometers, but the point is that the designs of existing goniometers represent a compromise to some extent because of the user interface aims which must be met also as well as possible.

In the present invention, the design of the goniometer mechanical positioning system is not constrained in this way. The movements controlled by the electromechanical drivers need not be independent of each other at all and need not even resemble a cartesian coordinate system. In the present invention, the mechanical positioning system in reality functions as a computer controlled robot arm having 5 or 6 or more degrees of freedom. Accordingly, all of the current technology pertaining to the construction and control of precision robot arms may be used to design an optimized goniometer mechanical positioning system. In accordance with this invention, the user interface has been uncoupled from the mechanical positioning system, so there are no design constraints or aims relating to the user interface which need to be met anymore by the mechanical positioning system. As mentioned, a redesign of the goniometer mechanical system is not required, but a redesign is possible without some of the conventional constraints and aims. Many textbooks have been written on the design and construction and theory of robot arms. More detailed information on robot arms and control may be found, for example, in the book entitled "Robot Analysis And Control" by H. Asada and J.-J. E. Slotine, published by John Wiley and Sons (1986), which is hereby incorporated by reference.

In FIG. 3, a machine reference coordinate system is shown (displaced to the left for clarity) which is very similar to the one shown in FIG. 2. To distinguish the two, this one has a subscript M added for each direction of control. This one also is a true orthogonal cartesian coordinate system, unlike the one shown in FIG. 2. It should be appreciated that the machine coordinate system used in the subject invention may be chosen arbitrarily. Thus, the same coordinate system illustrated in FIG. 2 could be used instead, so long all of the transforms which involve machine reference coordinates (to be described in further detail below) are modified accordingly. The machine reference coordinate system may be arbitrarily chosen because it largely exists only as a coordinate system into which commands in a user coordinate system are transformed, and from which the transformed user commands are converted into goniometer drive values (actually a vector) by an inverse kinematics transformation. In the preferred embodiment, the machine reference system is also used to perform collision avoidance computations. However, collision avoidance is not an essential part of the most basic embodiment of this invention. In theory furthermore, the drive vector itself might be used as the input for collision avoidance computation, and the inverse kinematics transformation could transform directly from the user reference system to the drive vector, thus eliminating the need for a machine reference system at all.

In accordance with this invention, a user's frame of reference is created based upon the image seen by the user (i.e., operator). As shown in FIG. 3, perpendicular $X_U$ and $Y_U$ axes are defined in the plane of the image itself and a $Z_U$ axis is defined perpendicular to the $X_U$ and $Y_U$ axes. Angular directions are also defined about each of these axes, namely $\alpha_U$ about the $X_U$ axis, $\beta_U$ about the $Y_U$ axis and $\gamma_U$ about the $Z_U$ axis. In addition, there is a second angular direction defined about the $Z_U$ axis, namely $\gamma_I$. $\gamma_I$ is a user commanded rotation of the image itself about the $Z_U$ axis, without any actual or effective rotation of the specimen itself being desired about the $Z_M$ axis.

Figure 4:
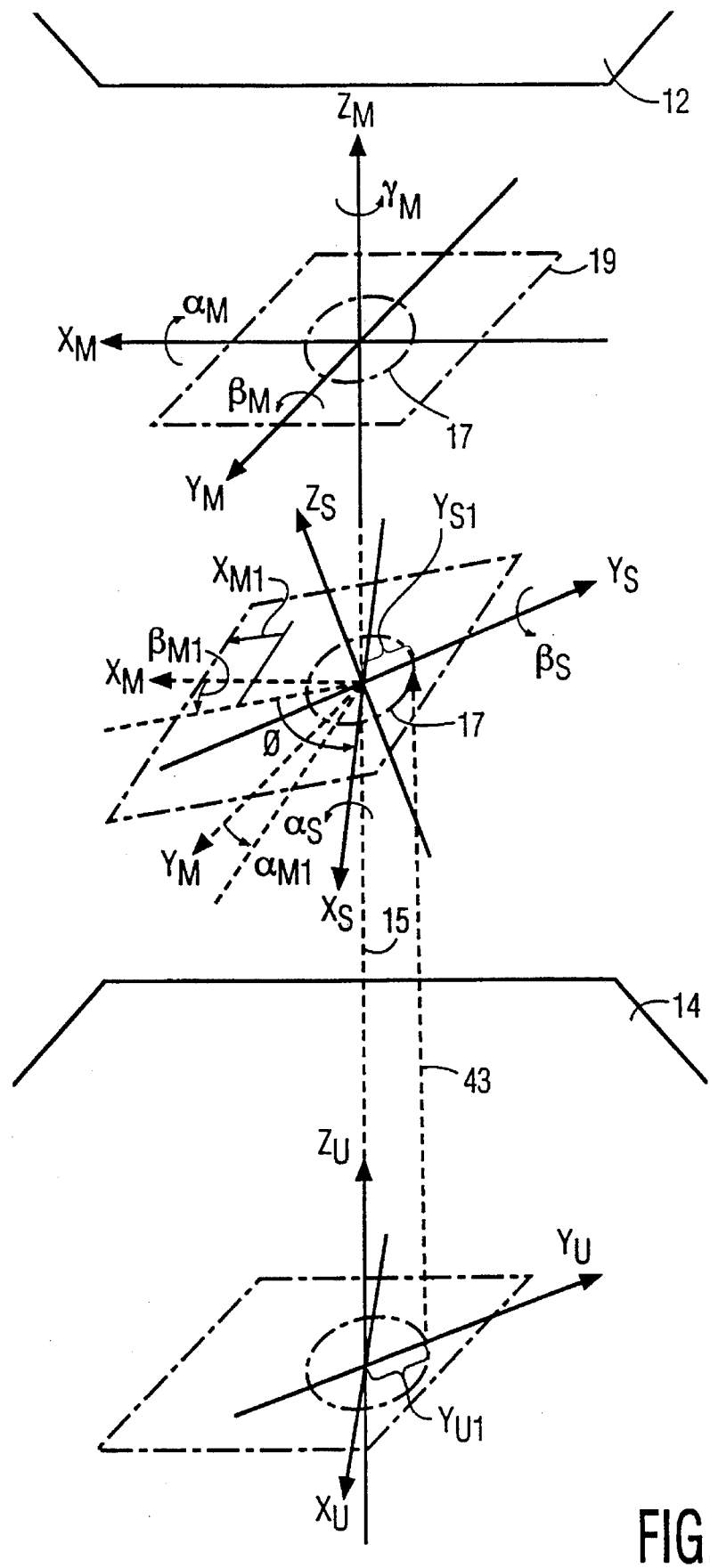
FIG. 4 relates the reference systems used in practicing a preferred embodiment of this invention to each other.

Before the difference between a $\gamma_I$ and a $\gamma_U$ command is described in further detail, however, the coordinate systems used to describe this embodiment and their relationships will be further described in reference to FIG. 4. The coordinate system shown at the top of FIG. 4 is the machine reference system mentioned earlier in connection with FIG. 3. The $Z_M$ direction coincides with the electron beam axis 15 of the electron beam column 12, 14. A specimen 19 is shown in long and short dashed lines. An irradiated spot 17 on the specimen is shown as a dashed line circle. Directions $X_M$, $Y_M$ and $Z_M$ are orthogonal with the origin actually midway between the poles of the electron beam column. The machine reference system has been displaced upward in FIG. 4 to make room for showing another coordinate system below it. In the illustrated position, the specimen has not been displaced or tilted at all.

Below the machine reference system coordinate system the same specimen 19 is shown in a displaced and tilted position and another coordinate system is shown with respect to the displaced and tilted specimen. The specimen has been displaced in the $X_M$ direction by an amount $X_{M1}$ and has been tilted in the $\alpha_M$ and $\beta_M$ directions by angles $\alpha_{M1}$ and $\beta_{M1}$ respectively. The irradiation spot 12 has not moved relative to the electron beam axis (though it has changed in shape slightly on the specimen due to the specimen tilt). The irradiation spot on the specimen has moved however because the specimen has been displaced.

A specimen surface coordinate system is shown superposed on the specimen. The surface coordinate system has an origin which remains at the electron beam axis but becomes tilted with the specimen. The $X_S$ and $Y_S$ axes are perpendicular to each other and coincide with the image plane of the specimen. Also, the $X_S$ and $Y_S$ axes are oriented so that they correspond with the $X_U$ and $Y_U$ directions of the user reference system. Movement across the image seen by the user in the $X_U$ direction therefore corresponds to movement in the $X_S$ direction across the specimen. This orientation for the $X_S$ axis and $Y_S$ axis is achieved by rotating the surface coordinate system about its $Z_S$ axis by an angle $\phi$.

$\phi$ is an overall angle of rotation offset between the machine reference system and the user reference system and is the sum of several components. One component is a characteristic rotary displacement that results from the helical path that electrons take as they travel from the specimen to the electron sensitive surface 18. This offset caused by the helical path changes not only when the electron beam column is adjusted differently, but also when the specimen is displaced in the $Z_M$ direction. The helical path component that changes with displacement of the specimen in the $Z_M$ direction is a constant H times this displacement. H is determined during a calibration phase of operation. One way H can be determined is experimentally. The user adjusts the H value while moving the image up and down in the $Z_U$ direction until the image stops rotating back and forth. The helical path component that does not change with $Z_M$ displacement of the specimen is part of an overall offset which is also determined during a calibration phase and has been called $\phi_O$. The proper value for $\phi_O$ can be determined also experimentally by the user. The user commands the image to move back and forth in the $X_U$ direction (or the $Y_U$ direction) while adjusting the value of $\phi_O$ until the image is correctly moving back and forth in the $X_U$ direction (or $Y_U$ direction). There may also be still another offset component caused by a deliberate electronic rotation of the image. Since the user controls this offset by user commands, this offset is known. The value of $\phi$ is determined by an image rotator module 65 shown in FIG. 3.

As shown in FIG. 4, the surface reference system also includes a direction of rotation $\alpha_S$ about the $X_S$ axis and a direction of rotation $\beta_S$ about the $Y_S$ axis. $\alpha_S$ coincides with $\alpha_U$ and $\beta_S$ coincides with $\beta_U$. An $\alpha_U$ commanded change thus causes an $\alpha_S$ rotation of the specimen and a $\beta_U$ commanded change causes a ds rotation of the specimen. However, $Z_U$ does not coincide with $Z_S$. A user does not expect the image to shift when the specimen is moved in the $Z_U$ direction, so the $Z_U$ direction coincides with the $Z_M$ direction! A $Z_U$ commanded movement results in a displacement of the specimen in the $Z_M$ direction.

Commanded displacements in the $X_U$ and $Y_U$ directions also result in displacement of the specimen in the $X_S$ and $Y_S$ directions, but a scaling factor needs to be introduced due to the $\alpha_S$ and $\beta_S$ tilts. The image scaling is actually determined at the image pickup surface 18 and therefore is scaled by a projection factor which needs to be undone when an $X_U$ or $Y_U$ command is transformed into the surface reference system. This is illustrated in FIG. 4. The tilted specimen 19 is actually projected upon a flat detection surface when the image is formed, as shown in the lower coordinate system, which coincides with the user reference system. Projection line 43 illustrates that a particular distance $Y_{U1}$ along the $Y_U$ axis corresponds to a slightly longer distance $Y_{S1}$ along the $Y_S$ axis, due to the tilt. The relationship is exactly determinable from the values of $\alpha_{m1}$ and $\beta_{m1}$.

Returning now to FIG. 3, a user inputs a $\gamma_U$ commanded change when the user desires to rotate the specimen (either actually or effectively) to change a crystallographic axis or plane, for example, with respect to an electron beam which is not normal to the specimen (i.e., $\alpha_M$ and/or $\beta_M$ are not zero). On the other hand, if the user only wants to rotate the image seen on the display without changing the specimen position or the image at all, the user inputs a $\gamma_I$ commanded change.

It should be noted that the prior art goniometer described in connection with FIGS. 1 and 2 did not have the capability of rotating the specimen (i.e., there was no $\gamma$ rotation direction capability illustrated or described in connection with FIGS. 1 and 2. So the motorized version of that goniometer illustrated in FIG. 3 also does not have that physical capability of actually rotating the sample. Nevertheless, the same effect can be produced as a rotation of the specimen, without actually rotating the specimen.

Clearly, if only an image rotation is desired, the specimen itself need not be rotated. Only the image needs to be rotated. An image rotation function is provided by an image rotator module 65, which may be implemented in separate hardware as shown or may be implemented with software in computer 64. Image rotation is a very common software or electronic function implemented in many ways in the art. Any prior art image rotation technique may be selected in practicing this invention. When an image rotation is desired, the $\gamma_I$ command is routed to the image rotator 65, which merely rotates the image by the commanded amount.

Simulation of a desired specimen rotation is also simple to implement. If $\alpha_M$ and $\beta_M$ are zero, a $\gamma_U$ command is equivalent to a $\gamma_I$ command and can be handled the same way. If $\alpha_M$ and/or $\beta_M$ are not zero, a $\gamma_U$ command may be simulated (i.e., a rotation of the specimen may be simulated) by modifying the values of $\beta_M$ and $\beta_M$ so as to cause the electron beam to become incident to the specimen at the same orientation that it would have if the specimen had actually been rotated. What happens is that the overall tilt of the specimen plane is not changed, but the specimen plane is caused to precess about the beam axis by the amount of effective rotation desired. Through such modification of the tilt angle values, the image produced by the electron beam becomes the same as if the specimen had been rotated instead, except that the image would also be rotated if the specimen had been actually rotated instead of simulating the effect by precessing the specimen surface. So it is necessary also to correct the image rotation to what it would have been. This may be done simply by sending a $\gamma_U$ command to the image rotator module 65, as shown in FIG. 3. The difference between a $\gamma_U$ change and a $\gamma_I$ change then is merely that a $\gamma_U$ change involves not only an image rotation but also changes to the tilt angles (equivalent to a precession of the specimen plane about the beam axis. The precession effect is a transform in the delta transform module 66.

If an operator wants to have the displayed view move up, on the other hand, a different input command is generated by the operator and referenced to the user's frame of reference, namely a command to change the $Y_U$ position (of the specimen). In response to this single command, the system automatically generates whatever specimen repositioning signals are needed to accomplish the commanded change to the displayed image.

The operator inputs a desired command in the user's frame of reference via an input interface 62 of a computer 64. This may be done using a keyboard command input, a mouse input, a joystick input, a touchscreen input, a voice command input, or any out kind of input the user input interface is designed to accept. Preferably the command inputs are expressed as changes from the current position and orientation since the current position and orientation is what the operator actually sees on the screen. A command from the operator therefore is simply expressed as a $\Delta X_U$ command, or a $\Delta Y_U, \Delta Z_U, \Delta \alpha_U, \Delta \beta_U, \Delta \gamma_I$ command or some combination of two or more of these.

An operator command to change the position and/or orientation of the specimen by a specified amount in each of one or more of the user's reference system directions is then sent to a parameter transform module 66 that converts the parameter change amounts expressed in the user's reference system (the user system $\Delta$ parameters) into parameter change amounts expressed in the machine reference system (machine system $\Delta$ parameters). Each non-zero user system $\Delta$ parameter is translated into at least one (and generally several) nonzero machine system $\Delta$ parameters. The value of each particular machine system $\Delta$ parameter may be expressed as a mathematical function of the user system $\Delta$ parameters and the current orientation values $\alpha_M$, $\beta_M$ and $\phi$. Accordingly the current values for $\alpha_M$, $\beta_M$ and $\phi$ are supplied as additional inputs to the parameter transform module 66.

Parameter translator 66 translates the 6 user system $\Delta$ parameters (only one or a few of which will be non-zero in general) into 5 machine system $\Delta$ parameters (some of which might be zero) and supplies them to another transform module 68. Transform module 68 converts the machine system $\Delta$ parameters into a new machine system position vector (i.e., a new set of position values and orientation angles in the machine reference system) by simply adding the machine system $\Delta$ parameters to the current machine system position vector. The new machine system position vector is supplied in turn to an inverse kinematics transform module 70. The inverse kinematics module converts the desired new machine system position vector for the specimen into drive signals $J_1$, $J_2$, $J_3$, $J_4$ and $J_5$, which in turn control the corresponding drivers 42, 44, 46, 48 and 50 to cause the mechanical positioning system 26 to bring the specimen to the new position defined by the new machine system position vector.

The branch of mathematics which deals with transform problems of this kind just described, namely where the desired motion of a system is expressed in a different coordinate system than the one in which it is to be executed and a transformation is needed from one to the other, has been well developed and is called kinematics. In this area of mathematics, the relationship between the two coordinate systems is expressed or represented as a kinematic model. The area which deals more particularly with the problem of calculating a drive vector for the system in which the motion is to be executed from the vector of desired motion when there are constraints and the solution might not be unique or even possible is called inverse kinematics. A more detailed description of these areas of mathematics and detailed information on the development of mathematical formulas (actually matrices) for making the above described transformations between coordinate systems may be found in the earlier cited textbook entitled "Robot Analysis and Control" by H. Asada and J.-J. E. Slotine. Inverse Kinematics is described in particular in section 2.3 of that book, pages 39–49.

A particularly convenient way of implementing the transforms in FIG. 3 is to use a software environment developed by the Assignee of this application called the Generic Motion Controller or GMC. The GMC software is available from the GMC Group of Philips Laboratories, Philips Electronics North America Corp., Briarcliff Manor, N.Y. 110510, USA. The GMC software creates an environment in which machines and transformations may be modelled in a kinematic description language (KDL) and then executed to control the machine. The following code has been created as an example of KDL code required to control a goniometer using the GMC:

```
model goniometer /* Compu-eucentric example */
parameter const /* in meters */
    A = 0.01,        /* size of cube representing base, and
goniometer body2 */
    LONGARM = 0.10,
    SHORTARM = 0.05,
    C = 0.005,   /* size of square sampleholder */
    S = 0.001,   /* characteristic size of specimen */
    AXES = .01
nominal
    xpos = 0,        /* xoffset of focus of attention */
    ypos = 0,        /* yoffset of focus of attention */
    zpos = 0         /* zoffset of focus of attention */
body base
    reference frame base:polecenter at IDENT
    frame base:ref at xltxyz
(-A-A-LONGARM-SHORTARM, -A/2, -A/2)
    frame base:tobody2 at xltxyz
(-A-LONGARM-SHORTARM,0,0) then roty(PI/2)
    frame base:pole_xmax at xltxyz(AXES,0,0)
    frame base:pole_xmin at xltxyz(-AXES,0,0)
    frame base:pole_ymax at xltxyz(0,AXES,0)
    frame base:pole_ymin at xltxyz(0,-AXES,0)
    frame base:pole_zmax at xltxyz(0,0,AXES)
    frame base:pole_zmin at xltxyz(0,0,-AXES)
    DEFCUBE(base,a,xltxyz
(-A-A-LONGARM-SHORTARM, -A/2, -A/2),
xltx(A), xlty(A), xltz(A))
```

```
body body2
    frame body2:tobase at xltxyz(0,A/2, A/2) then roty(PI/2)
    frame body2:toball at xltxyz(A+LONGARM, A/2, A/2)
then rotx(-PI/2)
    frame body2:ballbase at xltxyz(A+LONGARM, A/2, 0)
    DEFCUBE(body2,b,xltxyz(0, 0, 0), xltx(A), xlty(A), xltz(A))
    DEFCUBE(body2,c,xltxyz(A, 0, 0), xltx(LONGARM+A/2),
xlty(A), xltz(0))
body ball
    frame ball:tobody2 at rotx(-PI/2)
    frame ball:tobeam1 at rotx(PI)
body beam1 /* the beam of length LONGARM */
    frame beam1:toball at rotx(PI)
    frame beam1:start at xltx(-LONGARM)
    frame beam1:tobeam2 at roty(PI/2)
body beam2 /* the beam of length SHORTARM */
    frame beam2:tobeam1 at roty(PI/2)
    frame beam2:end at xltx(SHORTARM - C/2)
    frame beam2:tospecimenholder at xltx(SHORTARM) then
rotx(-PI/2)
    DEFCUBE(beam2,d,xltxyz(SHORTARM-C/2,
-C/2,0),xltx(C),xlty(C),xltz(0))
body specimenholder
    frame specimenholder:tobeam2 at rotx(-PI/2)
    frame specimenholder:tospecimen at IDENT
body specimen
    frame specimen:tospecimenholder at IDENT
    frame specimen:target at xltxyz(xpos, ypos, zpos)
    frame specimen:xmax_foa at xltxyz(xpos+S, ypos, zpos)
    frame specimen:xmin_foa at xltxyz(xpos-S, ypos, zpos)
    frame specimen:ymax_foa at xltxyz(xpos, ypos+S, zpos)
    frame specimen:ymin_foa at xltxyz(xpos, ypos-S, zpos)
    frame specimen:zmax_foa at xltxyz(xpos, ypos, zpos+S)
    frame specimen:zmin_foa at xltxyz(xpos, ypos, zpos-s)
    DEFCUBE(specimen,e,xltxyz(S,0,0),
xltx(S),xlty(S/2),xltz(S/5))
    DEFCUBE(specimen,f,xltxyz(0,-S,0),
xltx(-S/5),xlty(-S+S/5),xltz(S/4))
    DEFCUBE(specimen,g,xltxyz(-S/2, S/2, 0),
xltx(S/2),xlty(S/2),xltz(S/5))
DEFCUBE(specimen,h,xltxyz(-2*S,-2*S,0),xltx(4*S),xlty(4*S),
xltz(0))
joint x           prismatic
joint yangle      revolute
joint zangle      revolute
joint alpha       revolute
joint beta        revolute
joint gamma       revolute
connect alpha     from base:tobody2 to body2:tobase
connect x         from beam1:tobeam2 to beam2:tobeam1
connect yangle    from beam1:toball to ball:tobeam1
connect zangle    from ball:tobody2 to body2:toball
connect beta      from beam2:tospecimenholder to
specimenholder:tobeam2
connect gamma     from specimenholder:tospecimen to
specimen:tospecimenholder
locate specimen:target wrt base:polecenter
DRAWCUBE(base,a,1)
DRAWCUBE(body2,b,2)
DRAWCUBE(body2,c,2)
polyline 2 body2:ballbase, ball:tobody2
polyline 3 beam1:start, beam1:toball
polyline 4 beam2:tobeam1, beam2:end
DRAWCUBE(beam2,d,4)
DRAWCUBE(specimen,e,4)
DRAWCUBE(specimen,f,4)
DRAWCUBE(specimen,g,4)
DRAWCUBE(specimen,h,4)
polyline 5 base:pole_xmax, base:pole_xmin
polyline 5 base:pole_ymax, base:pole_ymin
polyline 5 base:pole_zmax, base:pole_zmin
polyline 3 specimen:xmax_foa, specimen:xmin_foa
polyline 3 specimen:ymax_foa, specimen:ymin_foa
polyline 3 specimen:zmax_foa, specimen:zmin_foa
endmodel
```

FIG. 3 generally describes the new user interface provided by the present invention, in which the operator specifies motion of the specimen in a user's reference system and a computer translates the specified motion into a drive vector for execution in the machine coordinate system. While this already assists the operator greatly in navigating about the specimen and in avoiding collisions of the moving parts with the polepieces, additional function preferably is added to the computer system to assure that no such collision will occur.

Figure 5:
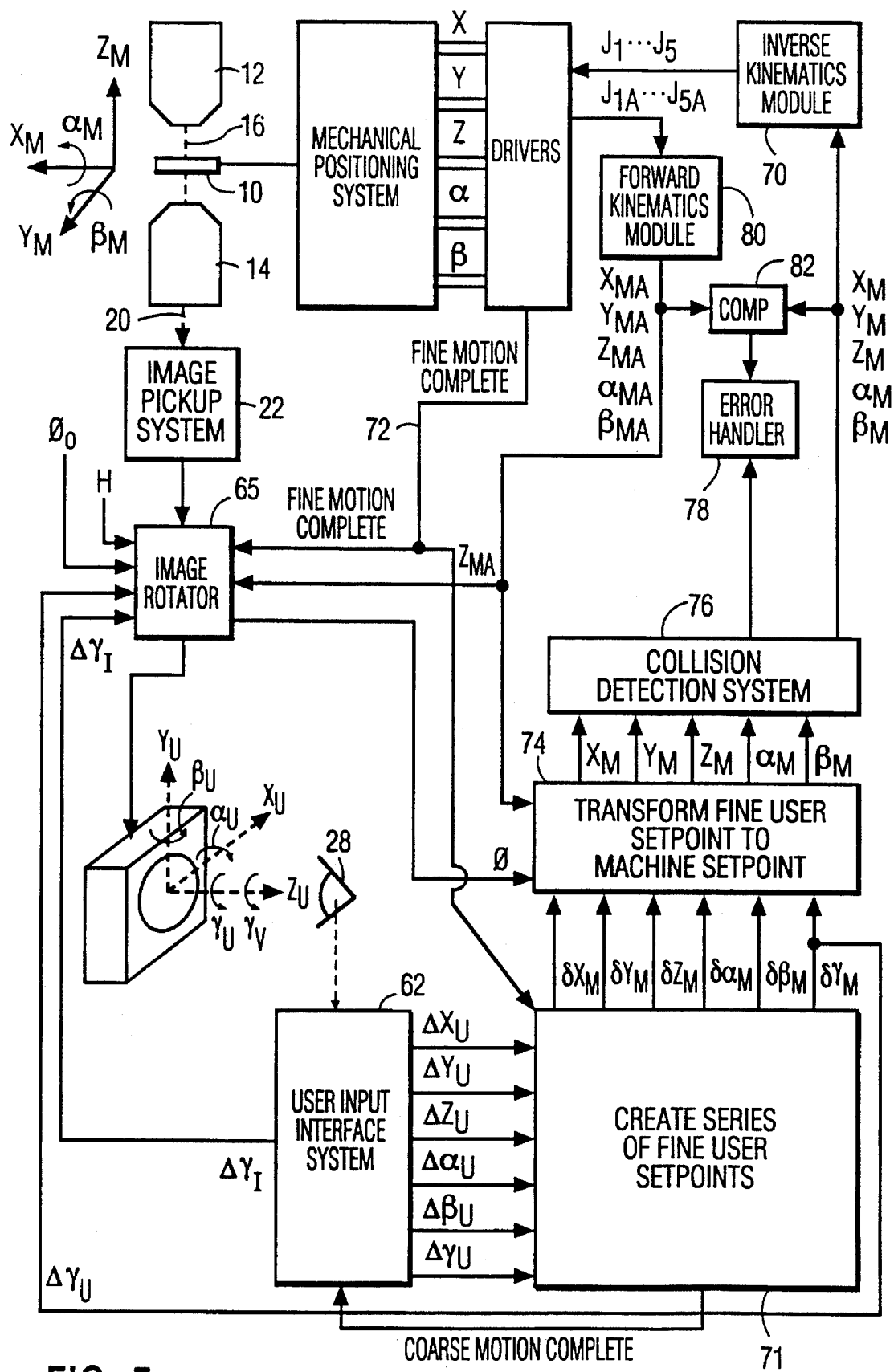
FIG. 5 is a block diagram of an improved embodiment of the present invention which also incorporates collision avoidance.

FIG. 5 is a schematic diagram of an improved electron microscope goniometer control system in accordance with this invention which also provides collision avoidance. This embodiment is similar to the FIG. 3 embodiment except that a user reference system command is interpolated into a series of user reference system setpoints and each of the user reference system setpoints in the series is checked for possible collision before it is implemented by the mechanical positioning system.

The user input interface 62 again generates a desired change vector in the user reference system, but in this embodiment, the user system change vector is converted into a series of fine steps (or setpoints) in the user frame of reference by an interpolation module 71. These fine user system setpoints are implemented one-by-one. A succeeding fine user setpoint is not processed until the previous one has been implemented, as indicated by a "fine motion complete" timing signal sent along path 72 to the interpolation module 71. This timing signal preferably is also sent to the image rotator module 65, so that the image seen by the user is updated also in a step-by-step fashion.

A fine user reference system setpoint is transformed into a machine reference system setpoint in module 74, which functions similarly to modules 66 and 68 in FIG. 3. The resulting machine reference system setpoint produced in module 74 is then checked for a possible collision condition by collision detection system 76. Any form of collision detection can be used. A preferred embodiment will be described later. If a collision condition is detected, system control is turned over to an error handler 78, which alerts the user. A machine reference system setpoint that causes a collision condition to be detected is not implemented by the drivers. If no collision is detected by module 76, the machine setpoint is sent to inverse kinematics module 70, which functions just like the inverse kinematics module in FIG. 3. It produces a drive vector $J_1 \ldots J_5$, which is implemented by the drivers.

Rather than just assume that the specimen is actually at a desired machine reference system setpoint (a fine machine system setpoint in this case) when the $J_1 \ldots J_5$ vector is sent to the drivers, the system in FIG. 5 obtains the actual drive position of all of the drivers, namely $J_{1A} \ldots J_{5A}$, and then computes the actual position of the specimen in machine reference system coordinates. This is done by a forward kinematics module 80. The computed actual position vector $X_{MA}$, $Y_{MA}$, $Z_{MA}$, $\alpha_{MA}$ and $\beta_{MA}$ is then compared to the desired machine system vector by comparator 82. In the event they do not match, an error condition has been detected and is sent to the error handler 78, which alerts the user.

The actual machine system vector $X_{MA}$, $Y_{MA}$, $Z_{MA}$, $\alpha_{MA}$ and $\beta_{MA}$ is sent to the transform module 74 for use in creating the next machine reference system setpoint. The $Z_{MA}$ value is also sent to the image rotator 65 for use in computing the $\phi$ value needed by the transform module 74. When all of the fine user setpoints have been implemented which correspond to a user command, the interpolator 71 will sense completion and unlock the user input interface system 62 for another user input command. While a user input command is being implemented (in small steps), the user input interface system is locked, so the user will not enter another command until the result of the current command is implemented and displayed to the user.

A preferred method of detecting a collision will now be described. It has been observed by us that the poles of an electron beam microscope tend to have a characteristic shape, and that this characteristic shape is approximately a truncated (i.e., cut off) elliptic paraboloid. A collision avoidance computation inherently requires that the objects which might collide need to be modelled in some way. So we prefer to model the poles as cut off or truncated elliptical paraboloids.

Figure 6:
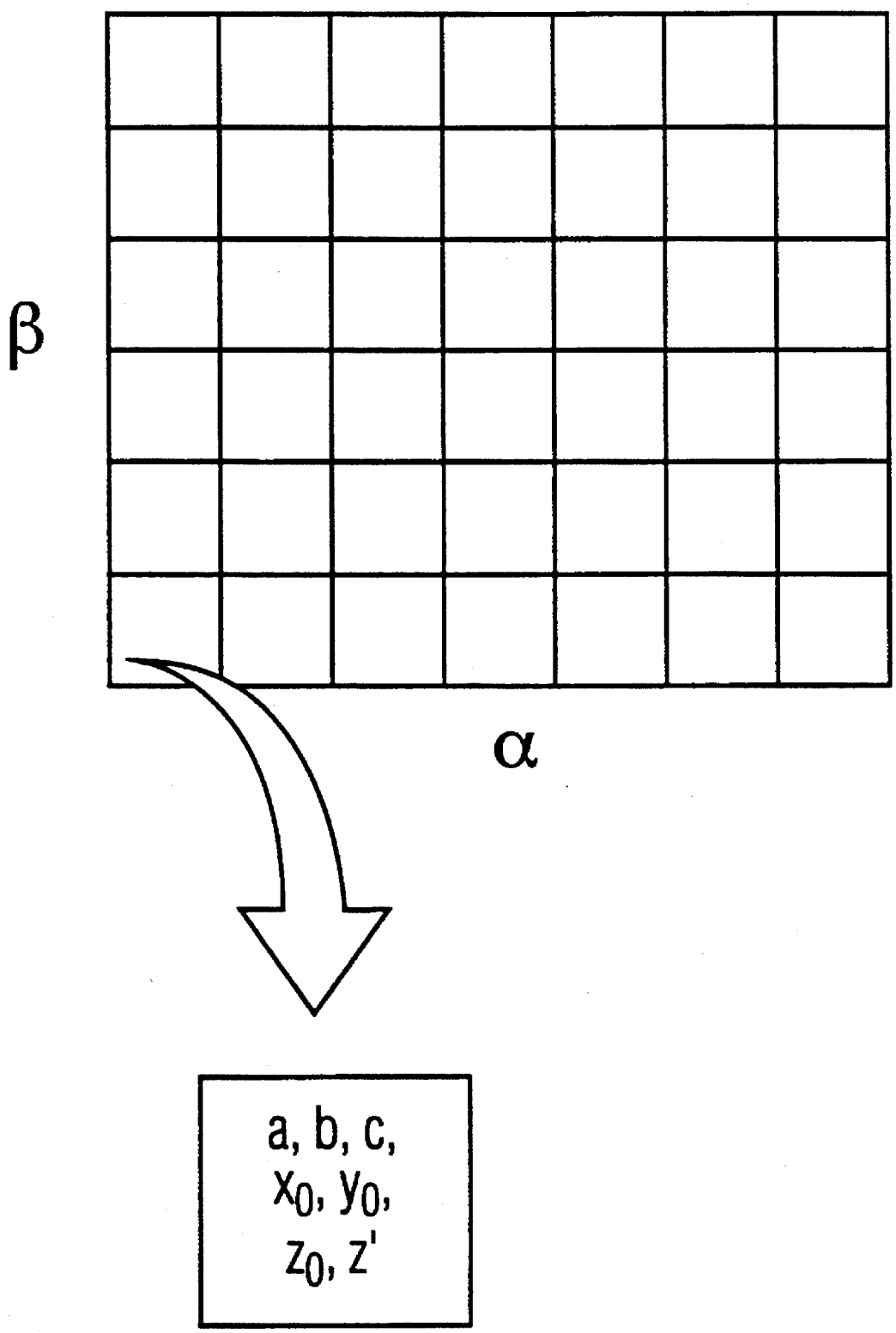
FIG. 6 shows a table used in connection with a preferred method of implementing collision avoidance.

At each particular combination of $\alpha_M$ and $\beta_M$, a forbidden zone can be computed or experimentally determined for each pole which is in the form of a truncated elliptic paraboloid. The parameters which define that elliptic paraboloid (for each pole) are then recorded in association with the $\alpha_M$ and $\beta_M$ values to form a table, such as the one shown in FIG. 6. The parameters in the box represent the parameters need to define a truncated elliptic paraboloid. A set of values for these parameters is determined for each combination of $\alpha_M$ and $\beta_M$ in the table (shown simply as $\alpha$ and $\beta$ in the table) and placed in the corresponding storage location.

Collision determination then is simply a matter of retrieving the set of parameters from the table entry which corresponds to the contemplated new values of $\alpha_M$ and $\beta_M$ and computing whether the contemplated new values for $X_M$, $Y_M$ and $Z_M$ fall within the truncated elliptic paraboloid represented by those retrieved parameters.

While the present invention has been described in particular detail in reference to a preferred embodiment, it should be appreciated that numerous modifications are possible within the intended spirit and scope of the invention.

What is claimed is:

1. An electron microscope having an electron beam column of electrons following a helical path and a mechanical positioning system for physically positioning a specimen with respect to the electron beam column, said electron microscope displaying an electron image of said specimen positioned in said column, said electron microscope utilizing a machine frame of reference defined by said mechanical positioning system and a user frame of reference defined by the displayed electron image of said specimen, said electron microscope comprising:

a user interface system for inputting repositioning commands from a user in said user frame of reference;

transform means for converting said repositioning commands from said user frame of reference into repositioning commands in said machine frame of reference; and electro-mechanical drivers for causing said mechanical positioning system to reposition said specimen in response to said repositioning commands in said machine frame of reference, whereby a user can control said mechanical positioning system from said user frame of reference while viewing the displayed electron image.

2. A goniometer for an electron microscope, said electron microscope having an electron beam column for irradiating a region of a specimen held in said goniometer with an electron beam of electrons following a helical path, an electron detector system for receiving an image of electrons from said irradiated region and for converting said received electron image into electrical signals and a monitor for converting said electrical signals into an image of said specimen displayed on a screen, said goniometer comprising:

an electro-mechanical stage for holding said specimen to be irradiated by said electron beam;

said stage having a plurality of movable joints interconnecting a plurality of rigid bodies for adjusting in a plurality of degrees of freedom the position of one of said bodies in a frame of reference fixed with respect to said microscope, said one body carrying said specimen;

each one of said joints having an electromechanical drive mechanism for positioning said each one joint in accordance with an input signal for said each one joint;

an input device for an operator of said microscope for generating a repositioning command for said specimen held by said stage in said electron beam while said image of said specimen is being displayed on said screen by said electron microscope;

said repositioning command defining a desired new position for said specimen in a frame of reference defined by said image of said specimen being displayed on said screen;

frame of reference transformation apparatus responsive to said repositioning command for converting said desired new position for said specimen from said frame of reference defined by said image of said specimen displayed on said screen to said frame of reference fixed with respect to said microscope; and an inverse kinematic controller responsive to said desired new position in said frame of reference fixed with respect to said microscope for providing input signals for said electro-mechanical drive mechanisms that tend to reposition said specimen to said desired new position, whereby said specimen may be repositioned by an operator of said microscope using a frame of reference defined by the displayed image of said specimen rather than a frame of reference fixed with respect to said microscope.

3. A goniometer as defined in claim 2 wherein said electromechanical stage includes three joints which provide linear displacement motion between two bodies and two joints which provide rotary motion between two bodies.

4. A goniometer as defined in claim 2 wherein said inverse kinematic controller includes means for assuring that said provided input signals will not cause a collision of any said body of said stage with another part of said microscope.

5. A goniometer as defined in claim 4 wherein said electron beam column includes a physical part in the vicinity of said goniometer which is modelled as a truncated elliptic paraboloid and collision of said goniometer stage with said modelled part is avoided by limiting said input signals to said electro-mechanical drives so as to avoid bringing any part of said goniometer stage within a forbidden zone modelled as a truncated elliptic paraboloid.

\* \* \* \* \*